United States Patent [19]
Chen et al.

[11] Patent Number: 4,507,834
[45] Date of Patent: Apr. 2, 1985

[54] DRILLING MONITOR

[75] Inventors: Tsu F. Chen, Dresher; Edwin R. Phillips, Rosemont, both of Pa.

[73] Assignee: Sperry Corporation, New York, N.Y.

[21] Appl. No.: 499,053

[22] Filed: May 27, 1983

[51] Int. Cl.³ .................. B23Q 15/00; B23B 49/00
[52] U.S. Cl. ..................... 29/26 R; 73/862.34; 408/6; 408/16; 409/134
[58] Field of Search ............ 29/26 A, 26 R, 56.5, 29/57, 64; 409/134; 408/6, 11, 16, 8; 73/862.34, 862.28, 355 R, 136 A; 374/121

[56] References Cited

U.S. PATENT DOCUMENTS 3,912,925 10/1975 Gaskell .......................... 408/6
4,347,748 9/1982 Pierson ....................... 73/862.34

FOREIGN PATENT DOCUMENTS 2156621 5/1973 Fed. Rep. of Germany ...... 374/121
110029 9/1981 Japan ........................ 73/862.34
2093991 9/1982 United Kingdom ........... 73/862.34
605699 5/1978 U.S.S.R. .......................... 408/6

OTHER PUBLICATIONS

"Temperature Measurement by Optical Pyrometry...", Traverse and Badie.
"Infrared Thermometer", Raytek Corp., 11-1965.

Primary Examiner—William R. Briggs
Attorney, Agent, or Firm—James R. Bell; Thomas J. Scott; Marshall M. Truex

[57] ABSTRACT

A drilling monitor employs laser optics and an associated signal processing device to provide intelligent control capable of making the optimum decision to maintain hole quality and maximize drill life during the drilling of via holes in a circuit board. Twist angle, bending and temperature of the drill are monitored and the drill motor and/or the board is controlled accordingly in response to present data being compared to preprogrammed acceptable standardized data.

5 Claims, 7 Drawing Figures

DRILLING MONITOR

BACKGROUND OF THE INVENTION

1. Field of the Invention

This invention relates generally to measuring and testing and more particularly to measuring torsional and bending stress of a drill bit during a drilling operation.

2. Description of the Prior Art

Circuit boards generally comprise a multi-layered substrate formed of a synthetic material such as glass-filled epoxy. Each layer includes metallic circuit connections formed thereon. Integrated circuit chips are mounted on the boards by inserting pins through via holes formed in the board. The via holes provide circuit interconnections between the chips and the various layers of the board as is well known. After the holes are drilled, solder plating is applied through each hole to provide electrical interconnection between the layers.

The via holes are very small and range upward from 5 mils. Accuracy, within a fraction of a mil, is important in forming the via holes. The via holes are formed by drilling so the drill must be made with great precision. These drills are commonly operated at speeds of up to 100,000 rpm and drill from about 50 to about 60 holes per minute.

Not only must these drills be made with precision but they must be used with precision. If drilling is improper, the quality of the via holes is unacceptable in terms of hole geometry, smear, electrical integrity and long term stability. Also, improper use will shorten drill life. Thus, it is important to monitor the drilling operation to assure that it is conducted within proper limits.

During a drilling operation, the via holes are drilled at the rate of about 1 hole per second. The drill passes through the board at about 3-4 mils per revolution. The board material offers resistance to the drill which results in torsional and bending stress acting on the drill. Torsional stress is caused by friction between the board and drill. The friction generates heat. Bending stress is caused by axially forcing the drill through the board. With the advent of other board materials, such as ceramics, drill resistance will be increased.

Various drilling monitor operations used in the past have included accelerometers used for vibration signature analysis, infra-red (IR) to monitor heat generation, and acoustic sensors to detect noise variations. These operations are limited; they monitor secondary parameters such as vibration, noise and heat rather than drill stress, a primary parameter, so that readings are modified and are not precise. Also, response time is slow. For example, the readings produced by accelerometers and IR monitors are modified by the media being drilled, and results produced by acoustic monitors are modified by the media and by the surrounding air.

The foregoing limitations vary, of course, with material to be drilled, the drill design and the material of the drill; there are many variables. Thus there is a need for a drilling monitor having fast response time, precision, and which monitors the drill stress to produce an unmodified signal.

The foregoing illustrates limitations of the known prior art. Thus, it is apparent that it would be advantageous to provide an alternative directed to overcoming one or more of the limitations as set forth above. Accordingly, a suitable alternative is provided including features more fully disclosed hereinafter.

SUMMARY OF THE INVENTION

In one aspect of the present invention, this is accomplished by providing a drilling monitor including means for measuring twist angle and bending of an associated drill bit. Twist angle is measured by first means sensing a fixed angular position associated with the drill and second means for sensing a relatively twisted angular position on the drill bit. Bending is measured by means sensing an image of the drill bit.

The foregoing and other aspects will become apparent from the following detailed description of the invention when considered in conjunction with the accompanying drawings. It is to be expressly understood, however, that the drawings are not intended as a definition of the invention but are for the purpose of illustration only.

DESCRIPTION OF THE PREFERRED EMBODIMENT

Figure 1:
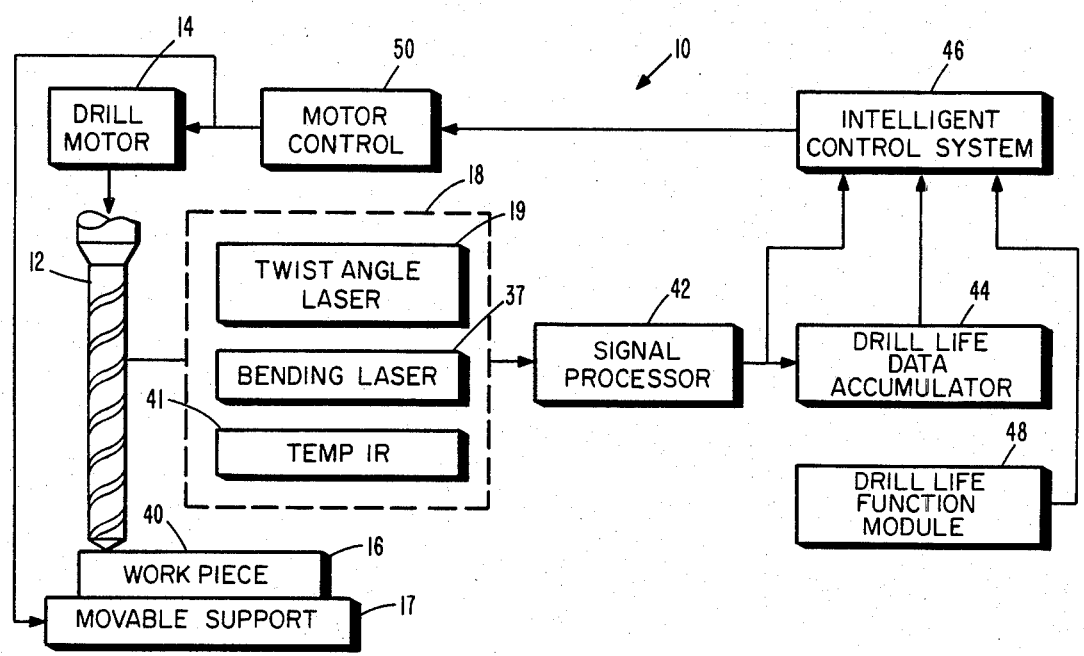
FIG. 1 is a flow chart graphically illustrating an embodiment of the drilling monitor of this invention.

FIG. 1 of the drawings illustrates an embodiment of a drilling monitor generally designated 10, for optimizing drill life and hole quality. An exemplary drill bit 12 is driven by a well-known drill motor 14. Drill 12 operates on a substrate work piece 16 at speeds up to 100,000 rpm and drills from about 50 to 60 via holes per minute. Workpiece 16 is mounted on an available movable support 17. Drill 12 passes through work piece 16 at about 3-4 mils per revolution. Resistance between the board and drill results in torsional and bending stresses acting on the drill, and a rise in temperature of the drill.

Means, generally designated 18, are provided for measuring instantaneous twist angle, bending and temperature of drill 12. Twist angle can be measured by sensing a fixed angular position compared with a relatively twisted angular position. Both of these measurements can be made at a drilling reference point such as on the drill bit, or, the fixed position can be measured on for example, the driving shaft or motor associated with the drill bit. The fixed position can be measured by using a photocell having an LED and sensor or by a proximity sensor based on electromagnetic or capacitance principles.

Figure 2:
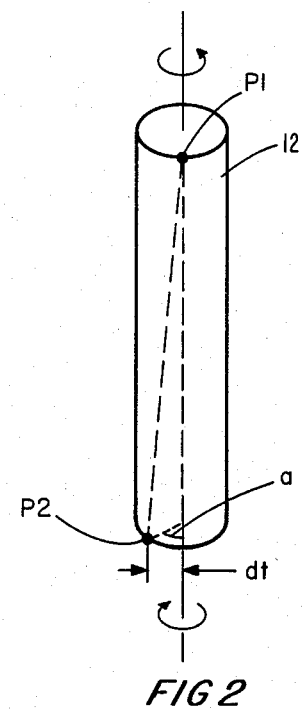
FIG. 2 diagrammatically illustrates twist angle.
Figure 4:
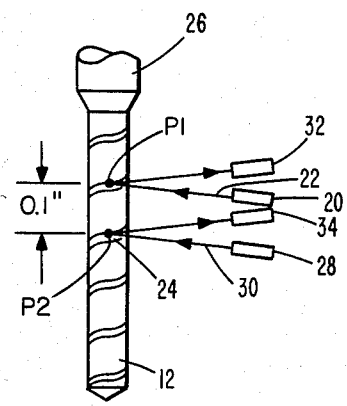
FIG. 4 diagrammatically illustrates two-spaced apart laser beams reflected from a drill.

Preferably, twist angle, designated "a" in FIG. 2, is measured by available laser optic means 19 including a laser 20, FIG. 4, directing a beam 22 at a point p1 on flute 24 of drill 12 adjacent shank 26. Another laser 28 directs a beam 30 at a point p2 on flute 24 of drill 12. It is preferred that point p2 be spaced from p1 at a distance of about 0.1 inches. Point p1, being adjacent shank 26 is at a substantially rigid portion of drill 12. Point p2 is spaced from point p1 at a less rigid portion of drill 12 so as to be displaced at a distance dt in response to drill 12 being twisted within the elastic range of instantaneous twist angle "a", which is deemed to be up to about 5 degrees.

Figure 5:
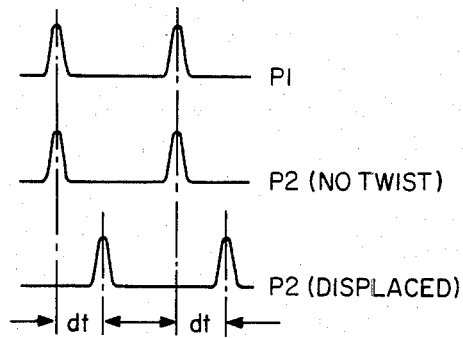
FIG. 5 diagrammatically illustrates visual indication of point displacement in response to drill twist.
Figure 6:
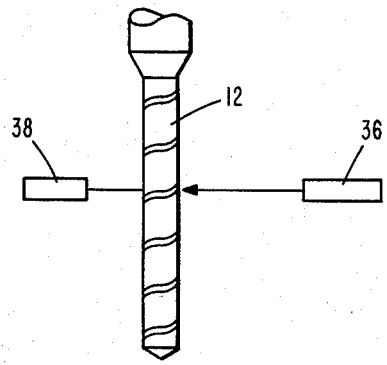
FIGS. 6 and 7 diagrammatically illustrate side and top views, respectively, of fiber optics used to detect drill bending.

Beams 22, 30 are reflected to and received by sensors 32, 34, respectively. When no twist angle "a" is produced, instantaneous data, exemplified in FIG. 5, could be visually provided to illustrate that blips or peaks representative of points p1, p2 will be in alignment. However, the peaks are misaligned when twist angle "a" is produced and p2 is displaced from p1 by distance dt, see also FIG. 2.

Figure 3:
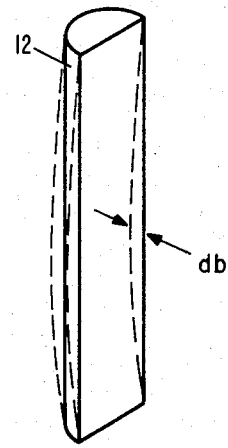
FIG. 3 diagrammatically illustrates bending.
Figure 7:
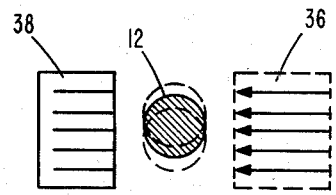

Bending of drill 12 is measured by an image measuring device which can be solid state but is preferably measured by available laser optic means 37 (FIG. 1) used in conjunction with a fiber optic bundle 36, (FIG. 7). It is believed that drill 12 can bend elastically up to a distance db of about 5 mils during via hole drilling operations (FIG. 3). Fiber optic bundle 36, on one side of drill 12, directs portions of a laser beam toward an opposed sensor 38 on another side of drill 12. Deflection of drill 12, as illustrated by dotted lines in FIG. 7, will interrupt certain portions of the laser beam directed by bundle 36 at sensor 38. In this manner, sensor 38 senses the interruptions and thus senses bending of drill 12.

Temperature is sensed, FIG. 1, by available infrared (IR) detector means 41. The IR radiation from a spot on drill 12, preferably adjacent the intersection of drill 12 and surface 40 of work piece 16, is picked up by a fiber optic bundle and lens assembly. Heat generated during drilling is carried away by work piece 16, drill 12, for drilled debris which is relieved from work piece 16, and by the surrounding air. It is realized that IR heat detection can be measured at various areas of the drill 12 and workpiece 16 but detection at the above-mentioned intersection is preferred. This is done because twist angle is directly related to stress and strain at the intersection and hole quality depends entirely upon the stress and strain at the intersection. Thus, heat detection at the intersection is relevant.

A signal processor 42 is coupled to receive instantaneous measurements of twist angle, bending and temperature from means 18. The signal is processed and may be in the form of a visual display, such as the example alluded to in FIG. 5, and the signal is sent simultaneously to a drill life data accumulator 44 and to an intelligent control system 46. The signal from signal processor 42 is in a form suitable for comparing the instantaneous stress, strain, and temperature measurements obtained by means 18, with two other sources of data and information, namely, the instantaneous data accumulated from drill 12 by the RAM memory of the drill life data accumulator 44, and preselected, comparative data in the RAM memory of a drill life function module 48 based on mechanical engineering knowledge taking into consideration drill material, drill design, drill speed, work piece material, etc. Thus, data stored in module 48 functions as a standard to optimize hole quality and drill life.

The intelligent control system 46 is of an available type capable of comparing data received from processor 42, accumulator 44 and module 48, processing the compared data and making decisions directed toward optimizing hole quality and drill life. The decisions of system 46 are based on the following options:

(1) to adjust drilling parameters in a pre-programmed sequence so that twist angle and bending of the drill are brought back to preselected limits;

(2) to stop drilling, since drill life is exhausted;

(3) to re-sharpen the drill, since drill life is not exhausted and drilling parameters cannot be brought back to the preselected limits; or (4) to stop drilling, since the drill is broken.

An available motor control 50 is coupled to receive instructions from system 46 and is further coupled to drill motor 14 and movable support 17. This permits actuation of motor control 50 to modify the speed of drill motor 14 and/or move work piece 16 and drill 12 apart.

The foregoing has described a drilling monitor which employs laser optics and an infrared detector to measure twist angle, bending and temperature directly from a drill. Instantaneous measurements are accumulated and compared with pre-established data. Associated signal processing circuitry and an intelligent control system cooperate to optimize hole quality and drill life.

It is anticipated that aspects of the present invention, other than those specifically defined in the appended claims, can be obtained from the foregoing description and the drawings.

Having thus described the invention, what is claimed is:

1. A drilling monitor comprising:
   means associated with a drill bit for measuring twist angle, including a first laser beam directed at a first reference point on said drill bit reflected to a first sensor, and a second laser beam directed at a second reference point on the drill bit reflected to a second sensor;
   image measuring means associated with said drill bit for measuring bending including a third laser beam on a first side of said drill bit directed by a fiber optic bundle at a sensor on a second side of said drill bit, opposite said first side, whereby said drill bit interrupts a portion of said third beam;
   means for measuring said drill bit temperature including an IR sensor directed at an intersection formed between said drill bit and a surface of an associated workpiece;
   signal processing means coupled for receiving instantaneous measurements of twist angle, bending and temperature of said drill bit;
   drill life data accumulator means coupled for receiving and accumulating instantaneous measurements from said signal processing means;
   means for controlling motor power for driving said drill bit;
   a drill life function module having preselected data therein;
   an intelligent control system coupled for receiving said instantaneous measurements from said signal processor, said accumulated measurements from said accumulator and said preselected data from said drill life function module and for comparing said measurements and data and for responsively generating instructions to said motor control means.

2. The drilling monitor of claim 1 wherein said first point is adjacent a shank portion of said drill.

3. The drilling monitor of claim 2 wherein said second point is spaced from said first point at a distance of about 0.1 inches.

4. The drilling monitor of claim 1 including:
   means coupled to said drill for providing driving, rotating power thereto.

5. The drilling monitor of claim 4 including:
   means for movably supporting an associated workpiece adjacent said drill, said support means and said power means being coupled to said motor control means.

* * * * *